US006429098B1

(12) United States Patent
Bensahel et al.

(10) Patent No.: US 6,429,098 B1
(45) Date of Patent: Aug. 6, 2002

(54) PROCESS FOR OBTAINING A LAYER OF SINGLE-CRYSTAL GERMANIUM OR SILICON ON A SUBSTRATE OF SINGLE-CRYSTAL SILICON OR GERMANIUM, RESPECTIVELY, AND MULTILAYER PRODUCTS OBTAINED

(75) Inventors: Daniel Bensahel; Yves Campidelli; Caroline Hernandez, all of Grenoble; Maurice Rivoire, Meylan, all of (FR)

(73) Assignee: France Télécom, Paris (FR)

( * ) Notice: Subject to any disclaimer, the term of this patent is extended or adjusted under 35 U.S.C. 154(b) by 0 days.

(21) Appl. No.: 09/659,913

(22) Filed: Sep. 11, 2000

Related U.S. Application Data

(62) Division of application No. 09/217,025, filed on Dec. 21, 1998, now Pat. No. 6,117,750.

(30) Foreign Application Priority Data

Dec. 29, 1997 (FR) ............................................. 97 16631

(51) Int. Cl.[7] ................................................ H01L 21/20
(52) U.S. Cl. ...................................... 438/478; 148/33.4
(58) Field of Search ................................. 438/478, 493, 438/933; 148/33, 33.4, 33.5, 33.6; 117/89, 93

(56) References Cited

U.S. PATENT DOCUMENTS 4,861,393 A * 8/1989 Bean et al.
5,354,700 A * 10/1994 Huang et al.
5,442,205 A   8/1995 Brasen et al.

FOREIGN PATENT DOCUMENTS

EP   0 524 114 A1   1/1993

OTHER PUBLICATIONS

Vasilevskaya, V.N. et al., "The structure and electrical characteristics of Si/Ge heterojunctions", Thin Solid Films 55 (1978) pp. 229–234 ( no month given).*

Meyer, et al., "The Deposition of Si–Ge Strained Layers from $GeH_4$, $SiH_2Cl_2$, $SiH_4$ and $Si_2H_6$", Thin Solid Films, vol. 222, No. 1/2, Dec. 20, 1992, pp. 30–32.

Fitzgerald, et al., "Line, Point and Surface Defect Morphology of Graded, Relaxed GeSi Alloys on Si Substrates", Thin Solid Films, vol. 294, 1997, pp. 3–10.

Chen, et al., "Epitaxy of $Si_{1-x}Ge_x$ by Ultrahigh–Vacuum Chemical Vapor Deposition Using $Si_2H_6$ and $GeH_4$", Japanese Journal of Applied Physics, vol. 34, No. 2/7b, Jul. 15, 1995, pp. L869–L871.

Aketagawa, et al., "Selective Epitaxial Growth of Si and $Si_{1-x}Ge_x$ Films by Ultrahigh–Vacuum Chemical Vapor Deposition Using $Si_2H_6$ and $GeH_4$", Japanese Journal of Applied Physics, vol. 31, No. 5a, May 1992, pp. 1432–1435.

Kissinger, et al., Stepwise Equilibrated Graded $Ge_xSi_{1-x}$ Buffer With Very Low Threading Dislocation Density on Si(001), Applied Physics Letters, 66 (16), Apr. 17, 1995, pp. 2083–2085.

French International Search Report, dated Sep. 11, 1998.

* cited by examiner

Primary Examiner—Keith Christianson
(74) Attorney, Agent, or Firm—Eric B. Meyertons; Conley, Rose & Tayon, P.C.

(57) ABSTRACT

The process consists in depositing, by chemical vapour deposition using a mixture of silicon and germanium precursor gases, a single-crystal layer of silicon or germanium on a germanium or silicon substrate by decreasing or increasing the temperature in the range 800–450° C. and at the same time by increasing the Si/Ge or Ge/Si weight ratio from 0 to 100% in the precursor gas mixture, respectively.

37 Claims, 3 Drawing Sheets

PROCESS FOR OBTAINING A LAYER OF SINGLE-CRYSTAL GERMANIUM OR SILICON ON A SUBSTRATE OF SINGLE-CRYSTAL SILICON OR GERMANIUM, RESPECTIVELY, AND MULTILAYER PRODUCTS OBTAINED

This application is a divisional of U.S. patent application Ser. No. 09/217,025 filed on Dec. 21, 1998, now U.S. Pat. No. 6,117,750.

BACKGROUND OF THE INVENTION

1. Field of Invention

The present invention relates in a general way to a process for obtaining a layer of single-crystal germanium on a substrate of single-crystal silicon or, conversely, a layer of single-crystal silicon on a substrate of single-crystal germanium.

2. Description of the Related Art

Silicon (Si) is the basic compound of microelectronics. It is currently available on the market in the form of wafers 200 mm in diameter. The performance limits of integrated circuits are in fact therefore those associated with the intrinsic properties of silicon. Among these properties, mention may be made of the electron mobility.

Germanium (Ge), which belongs to column IV of the Periodic Table of Elements, is a semiconductor. It is potentially more beneficial than Si since (i) it has a higher electron mobility, (ii) it absorbs well in the infrared range and (iii) its lattice parameter is greater than that of Si, thereby allowing heteroepitaxial structures using the semiconductor materials of columns III–V of the Periodic Table.

Unfortunately, germanium does not have a stable oxide and there are no high-diameter germanium wafers on the market, except at prohibitive prices.

$Si_{1-x}Ge_x$ alloys have already been grown on substrates of single-crystal Si. The alloys obtained only rarely have germanium contents exceeding 50% in the alloy.

Moreover, when SiGe alloys are grown on single-crystal Si, the growth of the SiGe alloy is initially single-crystal growth. The greater the thickness of the layer and the higher its germanium content, the more the layer becomes "strained". Above a certain thickness, the "strain" becomes too high and the layer relaxes, emitting dislocations. These dislocations have a deleterious effect on the future circuits which will be constructed on this layer and the relaxation of the layers causes certain advantages of the strained band structure (offsetting of the conduction and valence bands depending on the strain states: Si/SiGe or SiGe/Si) to be lost. Corresponding to each composition and to each production temperature there is therefore a maximum thickness or strained layer.

In some applications, the concept of "relaxed substrates" has been developed, that is to say $Si_{1-x}Ge_x$ layers are grown on silicon so as to exceed the critical thickness for a given composition, but by adjusting the deposition parameters for the layers so that the dislocations emitted do not propagate vertically but are bent over so as to propagate in the plane of the layer in order subsequently to evaporate at the edges of the wafer. Growth therefore takes place from increasingly germanium-rich layers, it being possible for the germanium gradient to change stepwise or in a continuous fashion.

However, the layers deposited by this "relaxed substrate" process either have a relatively, low (<50%) degree of germanium enrichment or have an unacceptable density of emergent dislocations for applications in microelectronics.

Thus, the article entitled "Stepwise equilibrated graded $Ge_xSi_{1-x}$ buffer with very low threading dislocation density on Si (001), by G. Kissinger, T. Morgenstern, G. Morgenstern and H. Richter, Appl.Phy.Lett. 66(16), Apr. 17, 1995", describes a process in which the sequence of the following layers is deposited on a substrate:

250 nm $Ge_{0.05}Si_{0.95}$+100 nm $Ge_{0.1}Si_{0.9}$+100 nm $Ge_{0.15}Si_{0.85}$+150 nm $Ge_{0.2}Si_{0.8}$.

After each layer has been deposited, it undergoes in situ annealing in hydrogen at 1095 or 1050° C. By way of comparison, similar sequences of layers have been deposited, but without annealing.

A 300 nm layer of $Ge_xSi_{1-x}$ of the same composition as the upper buffer layer is also deposited on the latter.

The specimens which did not undergo intermediate annealing have an emergent-dislocation density of $10^6$ cm$^{-2}$, whereas the specimen which underwent annealing has an emergent-dislocation density of $10^3$–$10^4$ cm$^{-2}$.

The article entitled "Line, point and surface defect morphology of graded, relaxed GeSi alloys on Si substrates", by E. A. Fitzgerald and S. B. Samavedam, Thin Solid Films, 294, 1997, 3–10, describes the manufacture of relaxed substrates comprising up to 100% germanium. However, the process employed takes a long time (more than about 4 hours per wafer) and is consequently unattractive from an industrial standpoint. Moreover, this process is not reversible, that is to say it does not allow pure silicon to be deposited on a germanium substrate.

Furthermore, during the fabrication of such relaxed substrates, a surface roughness is observed which increases depending on the deposition conditions and which may have negative defects—since they are cumulative—that is to say an onset of roughness can but increase during definition.

SUMMARY OF THE INVENTION

In one embodiment a process for obtaining, on a substrate of single-crystal silicon, a $Si_{1-x}Ge_x$ layer which has a high germanium content and which may be pure germanium, having a low emergent-dislocation density, and vice versa is described.

In one embodiment a process for obtaining a $Si_{1-x}Ge_x$ layer having a high germanium content and a very low surface roughness is described.

In one embodiment a process as defined above which may be implemented in an industrial reactor, for example an industrial single-wafer reactor is described.

According to the invention the process for obtaining a layer of single-crystal germanium or of single-crystal silicon on a substrate of single-crystal silicon or of single-crystal germanium, respectively, includes the chemical vapour deposition of a layer of single-crystal silicon or germanium using a mixture of germanium and silicon precursor gases, the said process being characterized in that:

a) in the case of deposition of the layer of single-crystal germanium, the deposition temperature is gradually reduced in the range of 800° C. to 450° C., preferably 650 to 500° C., while at the same time gradually increasing the Ge/Si weight ratio in the precursor gas mixture from 0 to 100%; and b) in the case of deposition of the layer of single-crystal silicon, the deposition temperature is gradually increased in the range of 450 to 800° C., preferably 500 to 650° C., while at the same time gradually increasing the Si/Ge weight ratio in the precursor gas mixture from 0 to 100%.

Any Si and Ge precursor gas, such as $SiH_4$, $Si_2H_6$, $SiH_2Cl_2$, $SiHCl_3$, $SiCl_4$, $Si(CH_3)_4$ and $GeH_4$, may be used in the process.

The preferred precursors are $SiH_4$ and $GeH_4$.

As is well known, the precursor gases are preferably diluted in a carrier gas such as hydrogen. The dilution factors may vary from 10 to 1000.

The chemical vapour deposition preferably takes place at low pressure, typically 8 kPa, but may also be carried out at atmospheric pressure by adapting the gas phases.

It has been determined that a pressure of about 8 kPa (60 torr) gave the best compromise between a high growth rate of the layers and deposition control.

Again preferably, the surface of the substrate is subjected to a preparation step prior to deposition.

This preparation step may conventionally be a surface cleaning step, for example any process in the liquid or gas phase which cleans the silicon surface of the metallic and organic residues, such as the conventional solutions SC1 ($NH_4OH+H_2O_2$) and $SC_2$ ($HCl+H_2O_2$) or else $H_2SO_4+H_2O_2$. In all cases, the cleaning is completed by a phase of treatment using a dilute HF aqueous solution followed by rinsing in water.

Preferably, the process is carried out in stages of defined duration during which the temperature and the gas fluxes are modified linearly as a function of time. In other words, in the case, for example, of deposition of a layer of pure germanium on a silicon substrate, the temperature is lowered from the maximum deposition temperature to the minimum temperature in stages of defined duration during which the temperature is reduced linearly from a first value to a second value. During this same time interval, the Ge/Si weight ratio in the precursor gas mixture is increased linearly, for example by varying the fluxes of the precursor gases. The last stage is that for which the minimum deposition temperature has been reached and in which the Ge/Si weight ratio of the precursor gas mixture is 100/0. The duration of this last stage depends on the desired thickness of the layer of pure germanium.

The number and duration of the stages may be determined depending on the total duration of the deposition process and on the optimization of the quality of the material deposited. In general, a total deposition time of approximately one hour is chosen, which corresponds to an industrially acceptable compromise between the quality of the material deposited (minimum surface roughness for a given total thickness) and total deposition time.

It is possible, if desired, to insert, between each variable-temperature and variable-flux stage, fixed-temperature but variable-flux deposition stages, or vice versa.

In order to grow pure Si on pure Ge, all that is required is to carry out the process as before but by reversing the directions of the temperature and flux variations.

It is therefore possible, to produce successive stacks of layers of pure germanium and of pure silicon on a substrate of single-crystal germanium or of single-crystal silicon.

Preferably, the process is carried out in a single-wafer reactor which allows greater controllability of the parameters (more rapid change of the gas compositions and of the temperature). However, any other suitable device such as, for example, a furnace may be used.

In another embodiment the above deposition steps (a) and (b) are carried out alternately in order to obtain a multilayer product having alternate layers of single-crystal silicon and single-crystal germanium.

In another embodiment multilayer products may be formed which include, for example, stacks of the following structures:

Si(single crystal)/$Si_{1-x}Ge_x$ (x varying from 0 to 1)/Ge (single crystal); Si(single crystal)/$Si_{1-x}Ge_x$ (x varying from 0 to 1)/$Si_{1-y}Ge_y$ (y varying from 1 to 0)/Si(single crystal); Si(single crystal)/$Si_{1-x}Ge_x$ (x varying from 0 to 1)/Ge(single crystal)/$Si_{1-y}Ge_y$ (y varying from 1 to 0)/Si(single crystal); Ge(single crystal)/$Si_{1-x}Ge_x$ (x varying from 1 to 0)/Si(single crystal); Ge(single crystal)/$Si_{1-x}Ge_x$ (x varying from 1 to 0)/$Si_{1-y}Ge_y$ (y varying from 0 to 1)/Ge(single crystal); Ge(single crystal) /$Si_{1-x}Ge_x$ (x varying from 1 to 0) /Si(single crystal)/$Si_{1-y}Ge_y$ (y varying from 0 to 1)/Ge(single crystal); and combinations of these stacks.

The multilayer products generally have an emergent-dislocation density $\leq 10^3/cm^2$.

Although the process described above limits the appearance of a rough surface, it is again desirable to reduce the surface roughness of the $Si_{1-x}Ge_x$ deposited.

Thus, the wafer specimens obtained by the process described above may have two surface roughnesses, namely a low roughness in the form of "hachured fabrics" of low amplitude (<60 nm) and a high roughness (>100 nm peak-to-valley) of longer wavelength.

In order to eliminate this roughness, a chemical-mechanical polishing step may be provided which eliminates either only the high roughness or all of the roughness. This chemical-mechanical polishing step may be implemented on $Si_{1-x}Ge_x$ layers for all germanium concentrations. Thus, the chemical-mechanical polishing may be carried out on a pure Ge or Si layer or on any intermediate layer before the pure Ge or Si layer is deposited. Furthermore, it is preferred to carry out this chemical-mechanical polishing stage on an $Si_{1-x}Ge_x$ layer for which x<1 or x>0, thereby making it possible to deposit, on the $Si_{1-x}Ge_x$ layer thus polished, by means of the process described above, relaxed layers of $Si_{1-x}Ge_x$ with increasing Ge or Si concentrations, starting from a deposited material having the same Ge and Si concentration as the polished layer, until a layer of pure Ge or Si is obtained. The final layer thus obtained is practically free of roughness.

Any type of chemical-mechanical polishing conventionally used in silicon technology may be used.

The principle of chemical-mechanical polishing is known and conventional and includes rubbing the wafer to be polished on a tissue imbibed with abrasive, applying pressure and moving this wafer with respect to the tissue. For further details, reference may be made to the Patents. The conjugate mechanical and chemical effects cause molecules of the polished materials to be preferentially removed from the regions in relief and planarize the material to be polished.

The polishing is controlled either in situ by control of polishing data, such as the current for the motors, or ex situ in a qualitative manner by optical or microscopic observations and/or in a quantitative manner by a technique of atomic force microscopy [measurement of the average (rms) or peak-to-valley roughness].

After polishing, encrusted mechanical residues may remain on the surface, which will be removed by mechanical brushing and rinsing.

After this cleaning, the polishing may leave a disturbed surface region and a treatment to regenerate the surface may be necessary. This treatment, which will be of the etching type, must nevertheless be carried out without causing the entire active layer to disappear. Several methods are possible.

It is possible either (i) to etch, by dry or wet etching, the layer or (ii) to oxidize the surface and then dissolve the oxide. Both these means will use the extreme sensitivity of Ge to oxygen (gaseous oxygen or ozone, or ozone dissolved in water, or plasma, etc.), the oxides of Ge being volatile or unstable.

After these treatments, epitaxial growth on the surface may be resumed, particularly using the process of the described above. In this preferred case, the desired surface finish (counting of defects) and therefore a "guaranteed" layer, the thickness of which may be adjusted depending on the envisaged application, is therefore immediately obtained. In addition, impurities are trapped by the subjacent dislocation network.

As indicated previously, the technique described above can be applied for any Ge concentration in the $Si_{1-x}Ge_x$ layer and gives very good results in terms of planarity and residual surface defects.

Nevertheless, for Ge concentrations typically above 70%, "holes" may appear after polishing, these corresponding to defects which were transferred into the upper layer. The density of these holes is about $10^4$ to $10^5$ df/cm$^2$. These holes are obviously not polished. These defects are probably stacking faults and/or defects associated with a linking, between two orthogonal guide planes (<110> directions), of the dislocations emitted in order to relax the growing structure. Two types of "holes" may exist:

(i) holes which have a depth not exceeding the upper constant-composition layer. In order to obviate these holes, a sufficient thickness of the desired final composition of the upper layer (typically pure Ge) must be deposited and polished until the "holes" disappear;

(ii) "deeper" holes in the form of an upside-down pyramid [on a substrate of (100) single-crystal Si]; the apex of the upside-down pyramid lies in the graded-composition layers, usually those with a Ge concentration above 55%. These holes, with sharp rectangular edges, are rounded in various ways by the polishing, but to the detriment of a greater region of extension. In order to limit these holes, one technique includes introducing, into the growth stages above a Ge concentration of 55%, steps in which the composition is constant (typically 300 nm every 10%, thereby increasing the process time per wafer, which time nevertheless remains acceptable). This has the effect of reducing the density of these defects;

(iii) another possibility for limiting the extension of the "deeper" holes includes fabricating a substrate with concentrations of up to about 70% and polishing, cleaning and resuming the growth by increasing the Ge concentration of the layers up to that desired. This may be carried out as many times as necessary. Thus, lower defect densities and a lower extension of these defects are obtained.

This variant of the process has several advantages;

Polishing machines and solutions conventionally used in silicon technology may be used for chemical-mechanical polishing;

Only very little material need be polished, this furthermore appearing as peak-to-valley material (in general about 200 nm). This leaves a great deal of freedom and allows the use of CMP solutions identical to those for silicon;

The disappearance of the "work-hardened" region after polishing is easy to achieve since compounds of Ge with oxygen are very unstable, i.e. they dissolve in any process containing oxygen (thermal oxidation or plasma-assisted oxidation, dissolution in ozonated water or in chemical solutions which selectively etched Ge, etc.)

It involves "light" polishing, that is to say a process with a high degree of freedom in the choice of thickness and of uniformity, if care is taken to initially produce a relatively thick layer to be polished (typically more than twice the peak-to-peak roughness to be removed);

Repeating the epitaxial growth of a layer having the same composition as that which has just been polished will "guarantee" the surface and make it possible to continue with other variations (other relaxed or strained layers above it), that is to say the starting surface is one without any roughness;

This technique may be extended to the reverse situation, that is to say to the formation of Si layers on Ge.

BRIEF DESCRIPTION OF THE DRAWINGS

The rest of the description refers to the appended figures which show, respectively.

DETAILED DESCRIPTION OF THE INVENTION

The process will now be described, with reference to FIGS. 1 and 2, in the case of the deposition of germanium on a substrate of single-crystal silicon.

The precursor gases used for the chemical vapour deposition are $GeH_4$ and $SiH_4$. The carrier gas is hydrogen ($H_2$) at a flow rate of 60 1/minute. The total pressure in the reactor is 8 kPa (60 torr).

Figure 2:
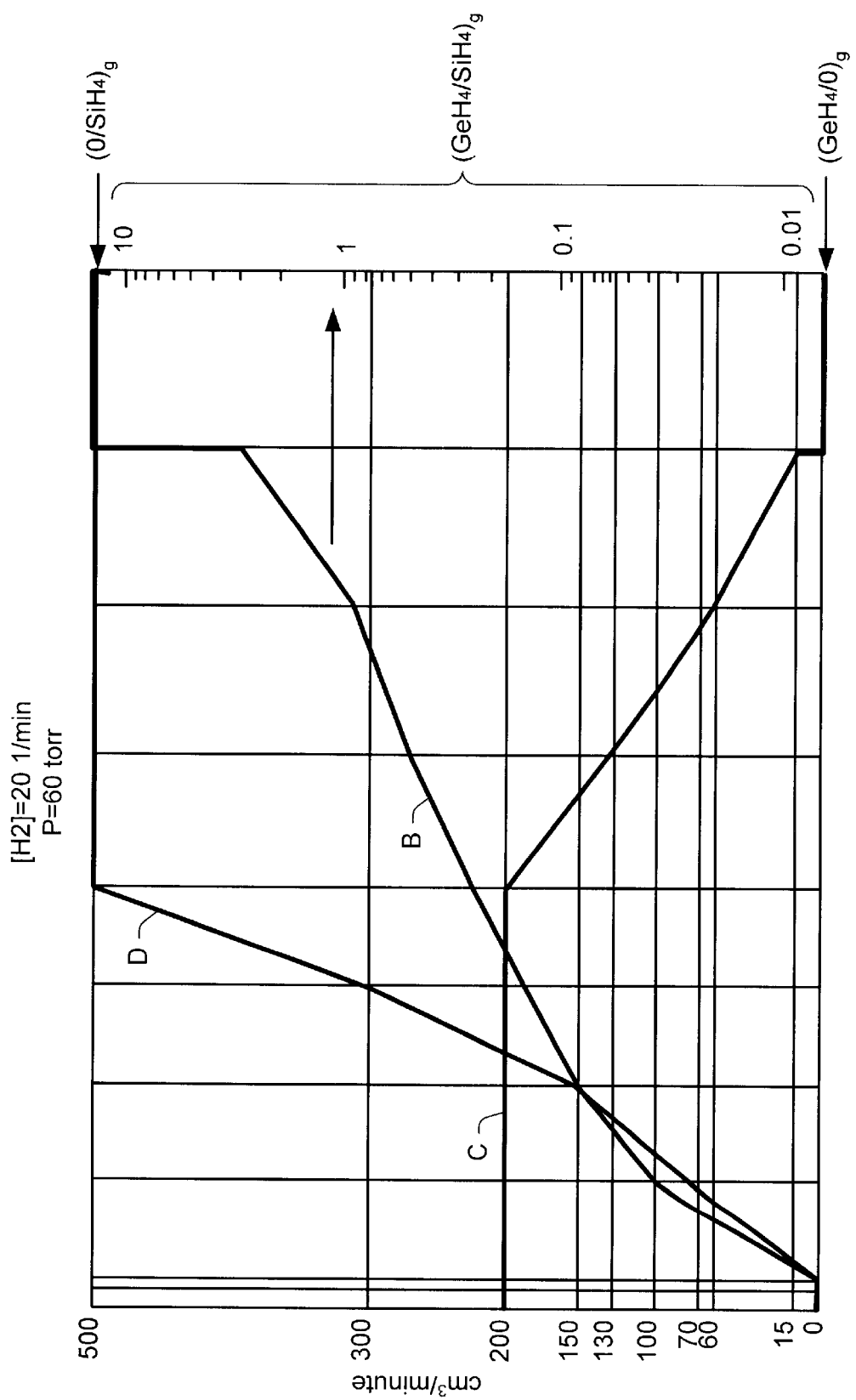
FIG. 2—graphs of the $SiH_4$ precursor gas flow rate (curve C) and $GeH_4$ precursor gas flow rate (curve D) as a function of time, together with a graph of the ratio of the flow rates of these precursor gases as a function of time (curve B)

As shown in FIG. 2, the flow rates of $SiH_4$ and of $GeH_4$ diluted to 10% in $H_2$ vary between 0 and 200 cm$^3$/minute and between 0 and 500 cm$^3$/minute respectively.

Figure 1:
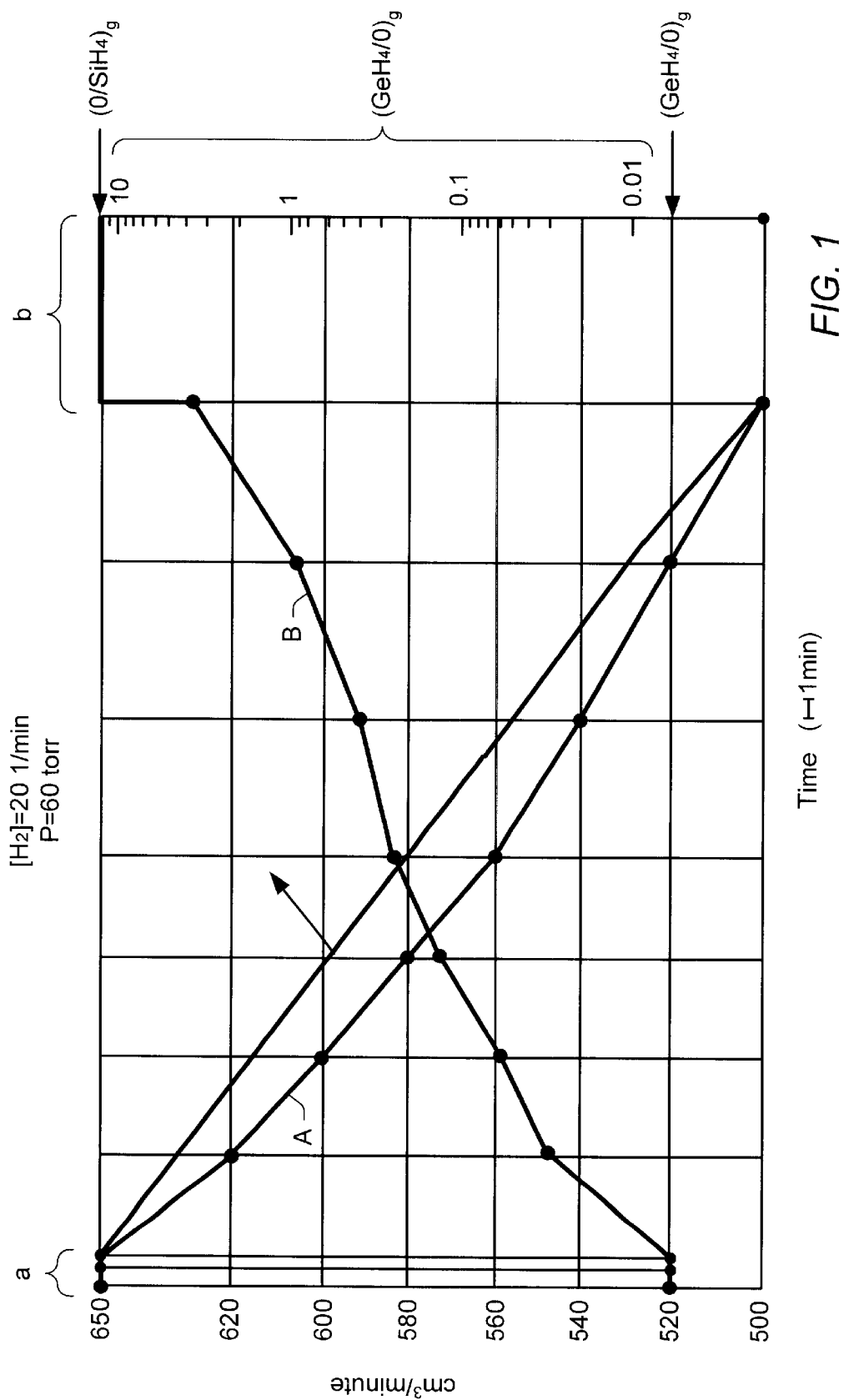
FIG. 1—a graph of the deposition temperatures as a function of time (curve A) and a graph of the ratio of the precursor gas ($GeH_4/SiH_4$) flow rates as a function of time (curve B)

Referring to FIG. 1, the temperature of the chemical vapour deposition is varied from 650° C. to 500° C. in stages while at the same time varying the Ge/Si weight ratio in the precursor gas mixture, for example by varying the $SiH_4$ and $GeH_4$ flow rates, as shown in FIG. 2 by curves C and D.

Part a of curve, A in FIG. 1 corresponds to the deposition at 650° C. of an epitaxially grown layer of pure silicon (buffer layer) serving solely to ensure that there is a good start for the subsequent epitaxial growths. This buffer layer may be omitted, depending on the quality of the cleaning of the Si substrate or of the Si wafers supplied by the manufacturer.

The part b corresponds to the deposition at 500° C. of a layer of pure germanium. The thickness of this layer will quite obviously depend on the duration of this deposition phase and is a function of the subsequent use envisaged.

In the implementation shown in FIGS. 1 and 2, the temperature is varied in stages and, at the same time, the Ge/Si weight ratio in the precursor gas mixture may be varied in stages.

Thus, in order to go from a temperature of 650° C. to 620° C., the two temperatures and the time for going from 650° C. to 620° C. are fixed. There is linear interpolation between the two temperatures.

The same procedure is employed for varying the respective flow rates of the precursor gases. Thus, as shown in FIG. 2, during the same time interval in which the temperature is lowered from 650° C. to 620° C., the $GeH_4$ flow rate is increased from 0 to 70 cm$^3$/minute while still maintaining the $SiH_4$ flow rate at 200 cm$^3$/minute, thus increasing the germanium content in the GeSi alloy layer deposited.

This procedure may be repeated in temperature stages while increasing the $GeH_4$ flow in stages until reaching 500 cm$^3$/minute, for a chosen temperature (for example, a temperature of 560° C.). Above this temperature, the flow of $GeH_4$ is maintained at 500 cm$^3$/minute and the flow of $SiH_4$ is lowered in stages from 200 cm$^3$/minute to 0, while at the same time the temperature is lowered in stages from 560 to 500° C.

Preferably, the temperature reduction curve must lie below the straight line joining the extreme temperatures, that is to say it must be a concave curve. The greater the concavity, the better the quality of the layers deposited (minimum roughness for a given total thickness). However, the greater this concavity, the longer the process. In general, a concavity will be chosen, and consequently a number of stages, such that the duration of the deposition process is acceptable from an industrial stand point, for example approximately one hour.

The process illustrated in FIGS. 1 and 2, was implemented in a single-wafer (200 mm wafer) reactor with a leakage rate of less than 1.33 Pa/minute (10 mτ/minute) in order to avoid $H_2O$ and $O_2$ contamination deleterious for germanium.

Figure 3:
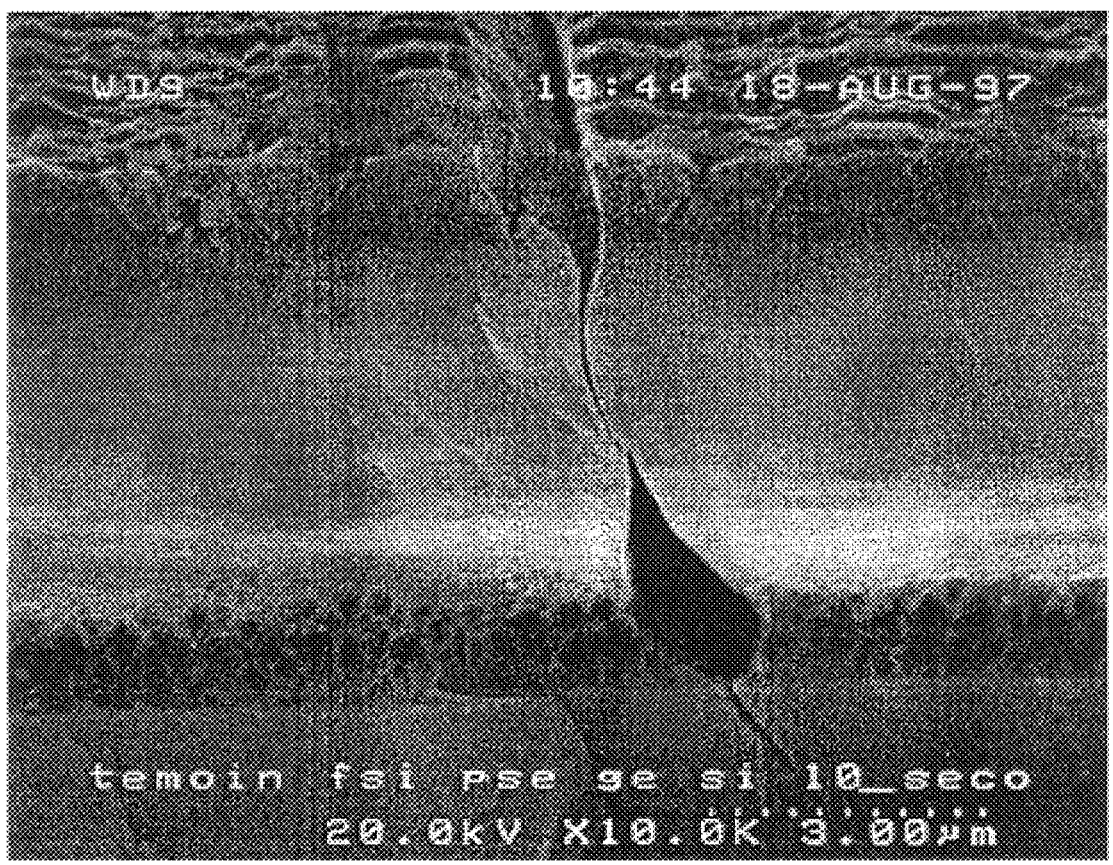
FIG. 3—a photomicrograph (10,000X) of a substrate coated with a stack of $Si_{1-x}Ge$ (x varying from 0 to 1)/$GeSi_{1-x}Ge_x$ (varying from 1 to 0)/Si layers.

FIG. 3 is a photomicrograph of a preferred multilayer product according to the invention.

The roughness seen in the photomicrograph (whether in the plane of section or on the surface) merely results from chemical decoration of the specimen, the purpose of this decoration simply being to increase the visual contrast between the various layers of the structure.

This multilayer product comprises the following structure:

Si(single-crystal substrate)/$Si_{1-x}Ge_x$ (x varying from 0 to 1)/Ge(single-crystal)/$Si_{1-y}Ge_y$ (y varying from 1 to 0)/Si(single-crystal).

There is no network of emergent dislocations in this multilayer product.

The chemical-mechanical polishing of the multilayer wafers obtained by the above process, having an upper layer of pure Ge with a thickness of about 400 nm, was carried out on an industrial machine of the Presi brand, of the E550 type, with a Rodel tissue, reference IC400 (a so-called "hard" tissue) and a Clariant abrasive, reference Klebosol 30N50PHN (a standard abrasive in silicon technology). Typical process parameters used for polishing the multilayer wafers are the following: pressure of 0.3 DaN/cm$^2$, plate-and-head speed of 0.8 m/sec and temperature of 15° C. After polishing, a rinsing step is carried out at a pressure of 0.15 DaN/cm$^2$ and at speeds of 1.4 m/sec, the abrasive being replaced by deionized water. After polishing, the wafers are brushed (in deionized water and $NH_4OH$) and dried in a machine of the Ontrack brand, SS200 type, in a conventional manner.

Of course, the various parameters mentioned above may be modified to a large extent depending on the polished layer and on the result desired.

The SiGe etching rate adopted is $\leq 80$ nm/min with a non-uniformity of less than 3% on wafers 200 mm in diameter.

The 0.2 $\mu$m particle content (excluding deep holes) is less than 0.8 defects/cm$^2$ and no microscratching was observed.

The planarization of the peaks after chemical-mechanical polishing results in a roughness of about 1 nm (root mean square value) after polishing for 5 minutes, having started with a Ge layer having peak-to-valley variations of 200 nm.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A material comprising:
   at least one Si—Ge layer disposed on a substrate comprising silicon and germanium wherein the ratio of silicon to germanium throughout the layer varies from about 0 to about 1, and wherein an emergent-dislocation density of the material is less than or equal to 10$^3$/cm$^2$.

2. The material of claim 1, wherein substrate comprises single crystal silicon.

3. The material of claim 2, wherein the ratio of silicon to germanium proximate a bottom surface of the Si—Ge layer is about 1 and wherein the ratio of silicon to germanium proximate a top surface of the Si—Ge layer is about 0.

4. The material of claim 3, further comprising a single-crystal germanium layer disposed on the Si—Ge layer.

5. The material of claim 3, further comprising an additional Si—Ge layer disposed on the Si—Ge layer, wherein the ratio of silicon to germanium proximate a bottom surface of the additional Si—Ge layer is about 0 and wherein the ratio of silicon to germanium proximate a top surface of the additional Si—Ge layer is about 1.

6. The material of claim 5, further comprising a single-crystal silicon layer disposed on the additional Si—Ge layer.

7. The material of claim 4, further comprising an additional Si—Ge layer disposed on the single crystal germanium layer, wherein the ratio of silicon to germanium proximate a bottom surface of the additional Si—Ge layer is about 0 and wherein the ratio of silicon to germanium proximate a top surface of the additional Si—Ge layer is about 1.

8. The material of claim 7, further comprising an additional single crystal Si layer disposed on the additional Si—Ge layer.

9. The material of claim 1, wherein the Si—Ge layer is disposed on a single crystal germanium layer.

10. The material of claim 9, wherein the ratio of silicon to germanium proximate a bottom surface of the Si—Ge layer is about 0 and wherein the ratio of silicon to germanium proximate a top surface of the Si—Ge layer is about 1.

11. The material of claim 10, further comprising a single-crystal silicon layer disposed on the Si—Ge layer.

12. The material of claim 10, further comprising an additional Si—Ge layer disposed on the Si—Ge layer, wherein the ratio of silicon to germanium proximate a bottom surface of the additional Si—Ge layer is about 1 and wherein the ratio of silicon to germanium proximate a top surface of the additional Si—Ge layer is about 0.

13. The material of claim 12, further comprising a single crystal germanium layer disposed on the additional Si—Ge layer.

14. The material of claim 11, further comprising an additional Si—Ge layer disposed on the single crystal silicon layer wherein the ratio of silicon to germanium proximate a bottom surface of the additional Si—Ge layer is about 1 and wherein the ratio of silicon to germanium proximate a top surface of the additional Si—Ge layer is about 0.

15. The material of claim 14, further comprising an additional layer of single crystal germanium disposed on the additional Si—Ge layer.

16. A material made by a process comprising:
depositing a Si—Ge layer upon a substrate from a mixture of silicon and germanium precursor gases, wherein during deposition of the layer, the ratio of silicon precursor gases to germanium gases is varied between about 0 and about 1, and wherein an emergent-dislocation density of the material is less than or equal to $10^3/cm^2$.

17. The material of claim 16, wherein the deposition temperature is gradually decreased from about 800° C. to about 450° C. while at the same time gradually increasing the weight ratio of germanium precursor gas to silicon precursor gas from 0 to 100%.

18. The material of claim 16, wherein the deposition temperature is gradually increased from about 450° C. to about 850° C., while at the same time gradually increasing the weight ratio of silicon precursor gas to germanium precursor gas from 0 to 100%.

19. The material of claim 16, wherein the process comprises increasing or decreasing the temperature linearly in stages of the desired duration and increasing the Ge/Si or Si/Ge weight ratio linearly during these stages.

20. The material of claim 16, wherein the process utilizes $SiH_4$ and $GeH_4$ as precursor gases.

21. The material of claim 16, wherein the process comprises one or more steps of chemical-mechanical polishing of the coated surface of the substrate or layers of single crystal germanium or of single crystal silicon.

22. The material of claim 16, wherein the process comprises increasing the germanium to silicon weight ratio by modifying the flow rates of the precursor gases.

23. The material of claim 16, wherein the process comprises alternating between decreasing the deposition temperature gradually from about 800° C. to about 450° C. while at the same time gradually increasing weight ratio of the silicon precursor gases to the germanium precursor gases from 0 to 100% and increasing the deposition temperature gradually from about 450° C. to about 850° C. while at the same time gradually increasing the weight ratio of the silicon precursor gases to the germanium precursor gases from 0 to 100%.

24. The material of claim 16, wherein the Si—Ge layer is disposed on a single crystal silicon layer.

25. The material of claim 24, wherein the ratio of silicon to germanium proximate a bottom surface of the Si—Ge layer is about 1 and wherein the ratio of silicon to germanium proximate a top surface of the Si—Ge layer is about 0.

26. The material of claim 25, further comprising a single crystal germanium layer disposed on the Si—Ge layer.

27. The material of claim 25, further comprising an additional Si—Ge layer disposed on the Si—Ge layer, wherein the ratio of silicon to germanium proximate a bottom surface of the additional Si—Ge layer is about 0 and wherein the ratio of silicon to germanium proximate a top surface of the additional Si—Ge layer is about 1.

28. The material of claim 27, further comprising a single crystal silicon layer disposed on the additional Si—Ge layer.

29. The material of claim 26, further comprising an additional Si—Ge layer disposed on the single crystal germanium layer, wherein the ratio of silicon to germanium proximate a bottom surface of the additional Si—Ge layer is about 0 and wherein the ratio of silicon to germanium proximate a top surface of the additional Si—Ge layer is about 1.

30. The material of claim 29, further comprising a single crystal silicon layer is disposed on the additional Si—Ge layer.

31. The material of claim 16, wherein the Si—Ge layer is disposed on a single crystal germanium layer.

32. The material of claim 31, wherein the ratio of silicon to germanium proximate a bottom surface of the Si—Ge layer is about 0 and wherein the ratio of silicon to germanium proximate a top surface of the Si—Ge layer is about 1.

33. The material of claim 32, further comprising a single crystal silicon layer disposed on the Si—Ge layer.

34. The material of claim 32, further comprising an additional Si—Ge layer disposed on the Si—Ge layer, wherein the ratio of silicon to germanium proximate a bottom surface of the additional Si—Ge layer is about 1 and wherein the ratio of silicon to germanium proximate a top surface of the additional Si—Ge layer is about 0.

35. The material of claim 34, further comprising a single crystal germanium layer is disposed on the additional Si—Ge layer.

36. The material of claim 33, further comprising an additional Si—Ge layer disposed on the single crystal silicon layer wherein the ratio of silicon to germanium proximate a bottom surface of the additional Si—Ge layer is about 1 and wherein the ratio of silicon to germanium proximate a top surface of the additional Si—Ge layer is about 0.

37. The material of claim 36, further comprising an additional layer of single crystal germanium disposed on the additional Si—Ge layer.

* * * * *